United States Patent
Ritter et al.

(10) Patent No.: US 9,877,411 B2
(45) Date of Patent: Jan. 23, 2018

(54) HEATSINK ALIGNMENT TO PRINTED CIRCUIT BOARD

(71) Applicant: THOMSON LICENSING, Issy les Moulineaux (FR)

(72) Inventors: Darin Bradley Ritter, Indianapolis, IN (US); Mickey Jay Hunt, Camby, IN (US); Kevin Michael Williams, Indianapolis, IN (US)

(73) Assignee: THOMSON Licensing, Issy-les-Moulineaux (FR)

( * ) Notice: Subject to any disclaimer, the term of this patent is extended or adjusted under 35 U.S.C. 154(b) by 0 days.

(21) Appl. No.: 15/035,244

(22) PCT Filed: Oct. 22, 2014

(86) PCT No.: PCT/US2014/061739
§ 371 (c)(1),
(2) Date: May 9, 2016

(87) PCT Pub. No.: WO2015/073176
PCT Pub. Date: May 21, 2015

(65) Prior Publication Data
US 2016/0295738 A1 Oct. 6, 2016

Related U.S. Application Data

(60) Provisional application No. 62/012,545, filed on Jun. 16, 2014, provisional application No. 61/903,471, filed on Nov. 13, 2013.

(51) Int. Cl.
*H05K 7/20* (2006.01)
*H01Q 1/02* (2006.01)
(Continued)

(52) U.S. Cl.
CPC ............. *H05K 7/2039* (2013.01); *H01Q 1/02* (2013.01); *H01Q 1/243* (2013.01);
(Continued)

(58) Field of Classification Search
CPC ........... H05K 7/2039; H01Q 9/18; H01Q 9/32
(Continued)

(56) References Cited

U.S. PATENT DOCUMENTS

| 4,847,449 A | 7/1989 | Jordan et al. |
| 5,870,286 A | 2/1999 | Butterbaugh et al. |

(Continued)

FOREIGN PATENT DOCUMENTS

| KR | 20110124677 | 11/2011 |
| WO | WO2011071516 | 6/2011 |

OTHER PUBLICATIONS

International Search Report for PCT/US2014/061739 dated Feb. 11, 2015.

*Primary Examiner* — Tuan T Dinh
*Assistant Examiner* — Mukund G Patel
(74) *Attorney, Agent, or Firm* — Richard Laperuta; Jerome G. Schaefer

(57) ABSTRACT

An electronic device, such as a set top box comprises an enclosure that houses a circuit board having a peripheral edge positioned in the set top box. A heat sink has orientation features on its periphery that contact and orient the circuit board. Further, the heat sink has positioning tabs at a leading edge that contact a control surface on a rear wall of the set top box enclosure and orients the heat sink within the set top box. Antenna assemblies are positioned in corners of the set top box enclosure and adjacent to one of the vertically oriented walls, wherein the antenna assemblies are positioned outside the peripheral edge of the circuit board and the periphery of the heat sink.

18 Claims, 17 Drawing Sheets

(51) Int. Cl.
 *H01Q 1/24* (2006.01)
 *H05K 1/02* (2006.01)
 *H05K 7/14* (2006.01)

(52) U.S. Cl.
 CPC ......... *H05K 1/0203* (2013.01); *H05K 7/1427* (2013.01); *H05K 7/20436* (2013.01); *H05K 2201/10098* (2013.01)

(58) Field of Classification Search
 USPC .......................... 361/718, 719, 720; 343/845
 See application file for complete search history.

(56) References Cited

U.S. PATENT DOCUMENTS

| | | | |
|---|---|---|---|
| 6,249,428 B1 | 6/2001 | Jeffries et al. | |
| 6,434,007 B1 | 8/2002 | Salmonson et al. | |
| 2002/0178279 A1 | 11/2002 | Janik et al. | |
| 2010/0182206 A1* | 7/2010 | Barbieri | H01Q 1/2291 343/702 |
| 2013/0347051 A1* | 12/2013 | Bose | H04N 21/418 725/151 |
| 2015/0288053 A1* | 10/2015 | Saxe | H01Q 1/243 343/702 |

\* cited by examiner

HEATSINK ALIGNMENT TO PRINTED CIRCUIT BOARD

CROSS-REFERENCE TO RELATED APPLICATIONS

This application claims the benefit, under 35 U.S.C. §365 of International Application PCT/US2014/061739, filed Oct. 22, 2014, which was published in accordance with PCT Article 21(2) on May 21, 2015 in English and which claims the benefit of U.S. Provisional Application No. 61/903,471, filed Nov. 13, 2013 and U.S. Provisional Application No. 62/012,545, filed Jun. 16, 2014, which is incorporated by reference herein in its entirety.

TECHNICAL FIELD

The present principles relate generally to electronic devices and, more particularly, to electronic devices having a heat sink in the vicinity of a printed circuit board.

BACKGROUND ART

Consumer/market preference for set top boxes and the like (such as computers, game consoles, DVD players, CD players, etc.) is to have such devices be small/compact. However, this requirement is becoming increasingly challenging, because set top boxes and the like are required to perform more functions, which require more internal components. This results in more challenges to appropriately manage the heat which is potentially detrimental, in these devices.

Wireless antennae have become one of the key components of many set top boxes and the like. However, these antennae enhance many of the challenges that the designer must face in designing advanced set top boxes and the like.

For example, to minimize the risk of electrostatic discharge associated with antennae, the major form of set top boxes have been enlarged to accommodate the vertical orientation of wireless antennae. The reason is wireless antennae for set top boxes are most often rectangular in shape and must be oriented inside the box to give the best performance possible. This means that there should be adequate clearance from metal parts in the box and that placement and orientation of antennae must be as diverse as possible within the box to work effectively with other internal components. Thus, the presence of the antennae enhances heat management concerns, because clearance needed about the periphery of the antennae coupled with the consumer preference for compactness and plurality of functions further concentrates the heat generating components within the set top box.

However, when such larger sizes of the set top box or the like that are associated with the vertical orientation of antennae are not deemed acceptable to the customer's preference, antennae have been oriented horizontally. This has unfortunately reduced antennae performance. As such, the trade-off has been that smaller size boxes commensurate with a horizontally oriented antenna have been produced with non-optimal antenna performance. In short, with the consumer/market aesthetics preference for electronic devices such as set top boxes to be as small and slim as possible, horizontal form factors are often the result and required, and with these form factors is the understanding of increasing component concentration, which increases the need for excellent heat management.

As such, a need exists for an antenna assembly that can function properly as an antenna, but yet meet consumer/market aesthetic requirements for a sufficiently slim electronic device in which there is a reduced propensity for electrostatic discharge.

Additionally, the need for slim devices to include many functionalities and many interior components causes such devices to generate excessive heat in general; and as such, the need for heat sinks is required. It is even more necessary to employ effective heat sinks when the consumer market demands that such devices such as set top boxes and the like to be quiet, because this requirement means that the use of fans is discouraged.

Unfortunately, heat sinks can be a good source for electrostatic discharge for antennae if the heat sink is too close to the antennae. This means that heat sink placement in devices with antennae in crowded devices needs to be accurate and precise to ensure that in mass production heat sinks will not cause electrostatic discharge.

Additionally, the aesthetic demands for smaller design forms of electronic devices cause printed circuit board components to be placed very close to each other and to heat sink mounting points, and as such, these demands create an opportunity for printed circuit board components to be damaged during assembly of the heat sinks to the printed circuit boards. This is especially so in high volume production environments. Hence, this risk of physical damage also creates a need to accurately and precisely align heat sinks in a safe manner.

With the above challenges in mind, the objectives of the present principles effectively address the above mentioned needs.

SUMMARY OF THE PRESENT PRINCIPLES

The present principles includes a design detail on the perimeter of a heat sink to provide alignment with the printed circuit board during assembly to prevent damage to components on the printed circuit board and/or ensure precise and accurate alignment with other component such as antennae to avoid discharge events.

In embodiments, an electronic device comprises: at least two vertically oriented walls 16, 17A, 17B, 76; a circuit board 5 having a peripheral edge positioned in the electronic device; a heat sink 6 contacting the circuit board, the heat sink having orientation features 79, 80 on a periphery of the heat sink. The orientation features orient the heat sink with respect to the circuit board. A first antenna assembly 15H, 15V can be positioned inside the electronic adjacent to one of the vertically oriented walls, wherein the first antenna assembly is positioned outside the peripheral edge of the circuit board and the periphery of the heat sink. The orientation features can comprise at least two positioning tabs 79 protruding from one edge of the periphery of the heat sink in which the positioning tabs contact the other of the vertically oriented walls. The heat sink can have a horizontal planar peripheral portion 12 from which two of the positioning tabs protrude in which the positioning tabs 79 rotationally align the heat sink about a central vertical axis with the printed circuit board. The positioning tabs can alternatively or additionally rotationally align the heat sink about a central vertical axis such that the heat sink is maintained a predetermined distance from the first antenna assembly. The orientation features can alternatively or additionally comprise alignment features 80 that extend vertically from two opposing edges of the periphery of the heat sink in which the alignment features 80 contact two opposing ends of the peripheral edge of the printed circuit board to orient the heat sink with the printed circuit board. the heat sink can have a horizontal planar peripheral portion 12 from which two of the positioning tabs and alignment features 80 protrude or extend.

Embodiments can include a second antenna assembly 15H, 15V positioned inside the electronic device in which the vertically oriented walls include a front wall 16; a first side wall 17A connected to a first end of the front wall to form a first corner; a second side wall 17B connected to a second end of the front wall to form a second corner; and a rear wall 76. Here, the first antenna assembly can be positioned adjacent to the first corner and the second antenna assembly 15H, 15V positioned adjacent to the second corner. The positioning tabs can rotationally align the heat sink such that the heat sink is maintained at a predetermined distance or distances from the first and second antenna assemblies.

The alignment features can extend vertically downward from the two opposing edges of the periphery of the heat sink and the alignment features can each comprise: a vertical wall portion 41 that contacts a vertical portion of the opposing ends of the peripheral edge of the printed circuit board; and horizontal ledge portion 42 that protrudes inwardly from the vertical wall portion, the horizontal ledge portion contact a horizontal surface of the printed circuit board near peripheral edge of the printed circuit board.

The electronic device can also include attachment means 72 that secures the heat sink to the circuit board and can also secures the circuit board to a bottom frame 2 of the electronic device as the alignment features orient the printed circuit board. The attachment means 72 can secure the heat sink to the circuit board through depressions 47 that extend toward the printed circuit board from the planar portion 12 of the heat sink and the attachment means 72 can secure the circuit board to a bottom frame at attachment points under the depressions.

BRIEF DESCRIPTION OF THE DRAWINGS

The present principles will be explained in greater detail in the following with reference to embodiments, referring to the appended drawings, in which.

DETAILED DESCRIPTION OF THE PRESENT PRINCIPLES

Figure 1:
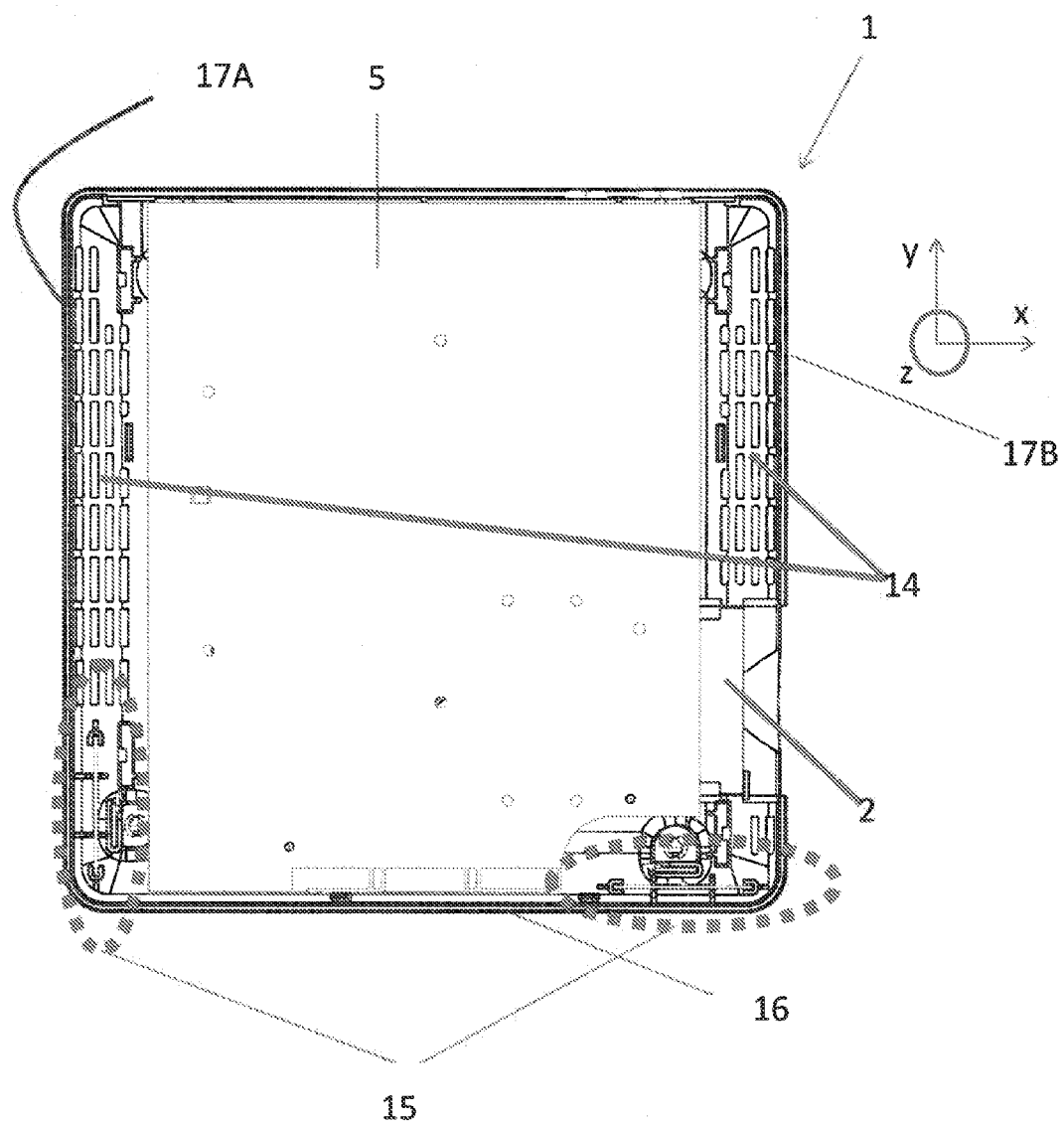
FIG. 1 is a top interior plan view of the set top box according to the present principles.

The present principles is directed to electronics devices such as set top boxes and the like which include antennae and positioning tabs 79 and alignment features 80 on the heat sink 6 as shown in FIGS. 8A and 8B. FIGS. 8A and 8B, which are disassembled views of an electronic device 1 showing a variety of features that can be included in the electronic device 1 according the present principles. As illustrated in the figures, a main circuit board 5 can be housed within a top cover 7 of the device. A thermal barrier (not shown) can be positioned between the circuit board 5 and a bottom frame 2. Alternatively, the circuit board 5 can be considered a circuit board assembly 5 having a thermal barrier attached thereto. A smart card reader (not shown) can be connected to the circuit board 5 through an aperture in the thermal barrier. The device 1 can have internal components such as the smart card reader, the thermal barrier, and a top heat sink 6 contact the circuit board 5 in which the circuit board 5 and the internal components are positioned between a bottom frame 2 and the top cover 7. The positioning tabs 79 and alignment features 80 on the heat sink 6 help to enable the heat sink 6 to be safely aligned and attached in the set top box to meet the objectives of the present principles present principles. The device can further include a bottom heat sink 6a under the circuit board 5. Either or both heat sinks can include vertical fins at either opposing ends of the heat sinks to promote heat dissipation. The thermal barrier can includes a thermal insulating material that preferably has substantially the same profile as the circuit board 5 or a profile that is at least 80% of the area profile of the circuit board 5. The thermal barrier keeps the smart card reader and other components under the circuit board 5 from overheating, in part, by preventing heat from transferring from the circuit board 5 and the components thereon to the component under the circuit board.

Figure 8:
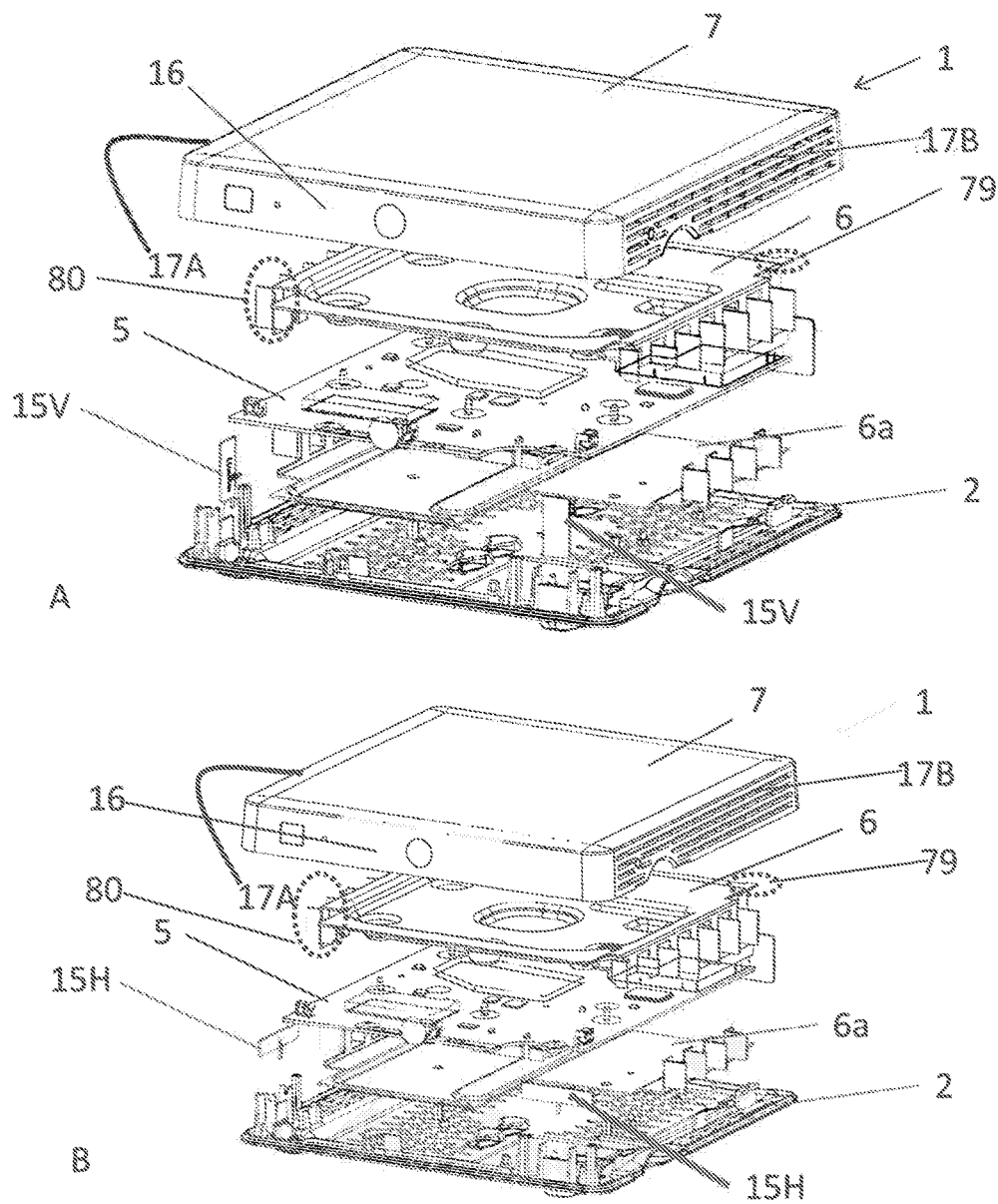
FIG. 8 shows disassembled perspective views of the set top box according to the present principles.

As can be gleaned from the introductory description of FIG. 8, the heat management system of the device according to embodiments of the present principles can be a very important feature of the present principles, especially when one needs to reduce the size of the electronic device. As such, the heat management system can advantageously work in concert with the antennae design disclosed herein. The reason is reducing the size of the housing in such devices disadvantageously concentrates the internal components and can cause detrimental overheating. As such, the heat sink 6 can be advantageously employed to provide a heat extracting and/or dissipating feature that efficiently removes heat from the circuit board 5.

The heat sink 6 can have a top plan profile that completely covers the circuit board 5 or substantially covers the circuit board 5 such that at least 80% of the circuit board 5 is covered. The heat sink 6 can include a thermal contact pad. The heat sink 6 is a contoured plate that has a generally planar periphery 12 and a recessed feature such as a central depression into a plane of the planar periphery, wherein the planar periphery preferably surrounds the central depression. The central depression has side walls extending from the planar periphery and forming an obtuse angle therewith. The central depression has a flat bottom that is designed to contact the circuit board 5, the heat generating components on the circuit board 5, and/or the thermal pad.

FIGS. 8A and 8B further shows that the electronic device 1 includes two separate antenna assemblies which can work in concert to optimize the transmission/reception angles. One antenna assembly 15V, 15H (in which "V" denotes a vertical orientation and "H" denotes a horizontal orientation) can be at the corner of the left side wall 17A and the front wall 16 and the other antenna assembly 5 can be at the corner of the right side wall 17B and the front wall 16. The planar broad surfaces of the antenna assemblies can be oriented perpendicular to each other to enhance transmission/reception angles. Ideally, the two antennae shown in FIG. 8 are perpendicular to each other, but their orientations can be parallel to one another and each of the antennae can also be rotated 90 degrees so that the antenna on the left is parallel to the front wall 16 (which can house various control buttons, light indicators, logos, light pipes, etc.), and the antenna on the right is parallel to the right front wall 17b. FIG. 8A shows a vertical orientation of the antennae 15V and FIG. 8B shows a horizontal orientation of the antennae 15H.

FIG. 1 highlights the positioning of the antenna assemblies 15. A key point regarding proper antenna performance is that the antenna assemblies 15 should be clear of metal components. This is ensured by having the antenna assemblies 15 being positioned outside the periphery of the printed circuit board 5. Ideally, no part of the antenna assemblies should be within 20 mm of metal components; as such, no part of the antenna assemblies 15 should be within 20 mm of printed circuit board, because the main printed circuit board 5 can include metal components thereon. The positioning tabs 79 and alignment features 80 on the heat sink 6 help to maintain the preferred spacing or gap of components from the antenna assemblies. This figure further shows that the electronic device can include two separate antenna assemblies which can work in concert to optimize the transmission/reception angles: one antenna assembly 15 can be at the corner of the left side wall 17A and the front wall 16 and the other antenna assembly 15 can be at the corner of the right side wall 17B and the front wall 16. The planar broad surfaces of the antenna assemblies can be oriented perpendicular to each other to enhance transmission/reception angles. In this drawing, both the horizontal and vertical antenna types are shown, but in operation one or the other is employed. The vents 14 shown in FIG. 1 can be a key part of the heat management system of the device 1 and these vents can be positioned in the base frame 2 and outside the horizontal profile of the circuit board 5.

Figure 2:
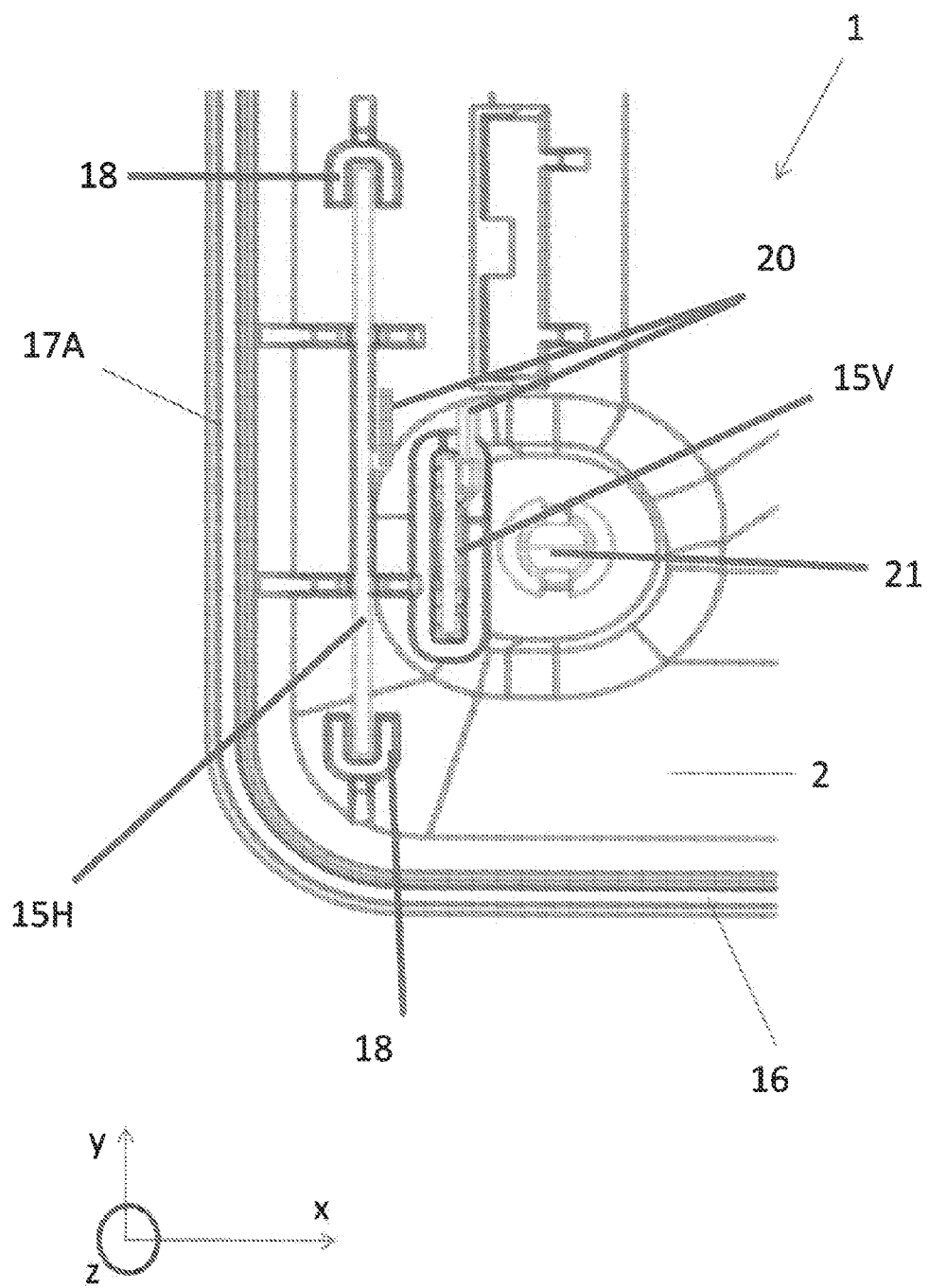
FIG. 2 is a top interior plan view of a section of the set top box according to the present principles.

FIG. 2 highlights the one antenna assembly 15 at the corner of the left side wall 17A and the front wall 16. This view also shows that the antenna assemblies 15H, 15V according to the present principles can have either a horizontal orientation in which the long axis of the rectangular antenna assembly runs horizontally (along the X-Y plane) or can have a vertical orientation in which the short axis of the rectangular antenna assembly runs horizontally (along the X-Y plane). In the horizontal orientation, the antenna assemblies 15H can be held by a pair of U-shaped pockets 18 with vertically oriented slots that face each other in which the vertical edges of the antenna assemblies 15H are held by the slots.

Figure 3:
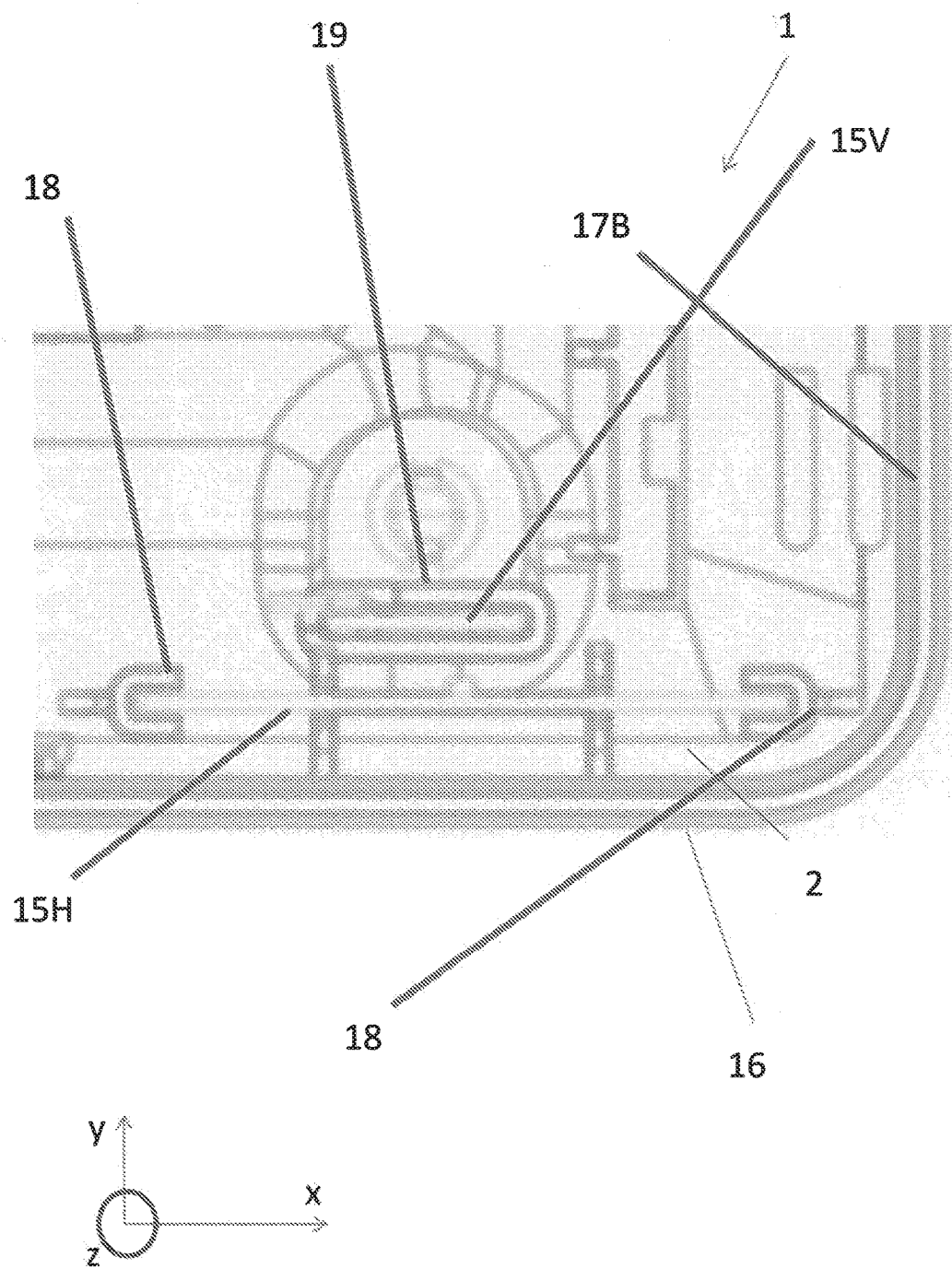
FIG. 3 is a top interior plan view of another section of the set top box according to the present principles.

FIG. 3 highlights the one antenna assembly 15 at the corner of the right side wall 17B and the front wall 16. This view also shows that the antenna assemblies 15H, 15V according to the present principles can have either have a horizontal orientation in which the long axis of the rectangular antenna assembly runs horizontally (along the X-Y plane and the short axis is vertical) or can have a vertical orientation in which the short axis of the rectangular antenna assembly runs horizontally (along the X-Y plane and the long axis is vertical). In the vertical orientation the antenna assemblies 15V can be held by a slot 19 that has a horizontal profile in the X-Y plane that matches the edge profile of the antenna assemblies 15V to hold the antenna assemblies 15V securely when the antenna assemblies 15V is slid into the slot 19.

FIGS. 2 and 3 also show possible rubber foot 21 mounting locations. These locations can be in the vicinity of the antenna assembly or these locations can overlap with the antenna assembly mounted in the bottom frame 2. The feet 21 are important for heat management system which will be discussed below.

Figure 4:
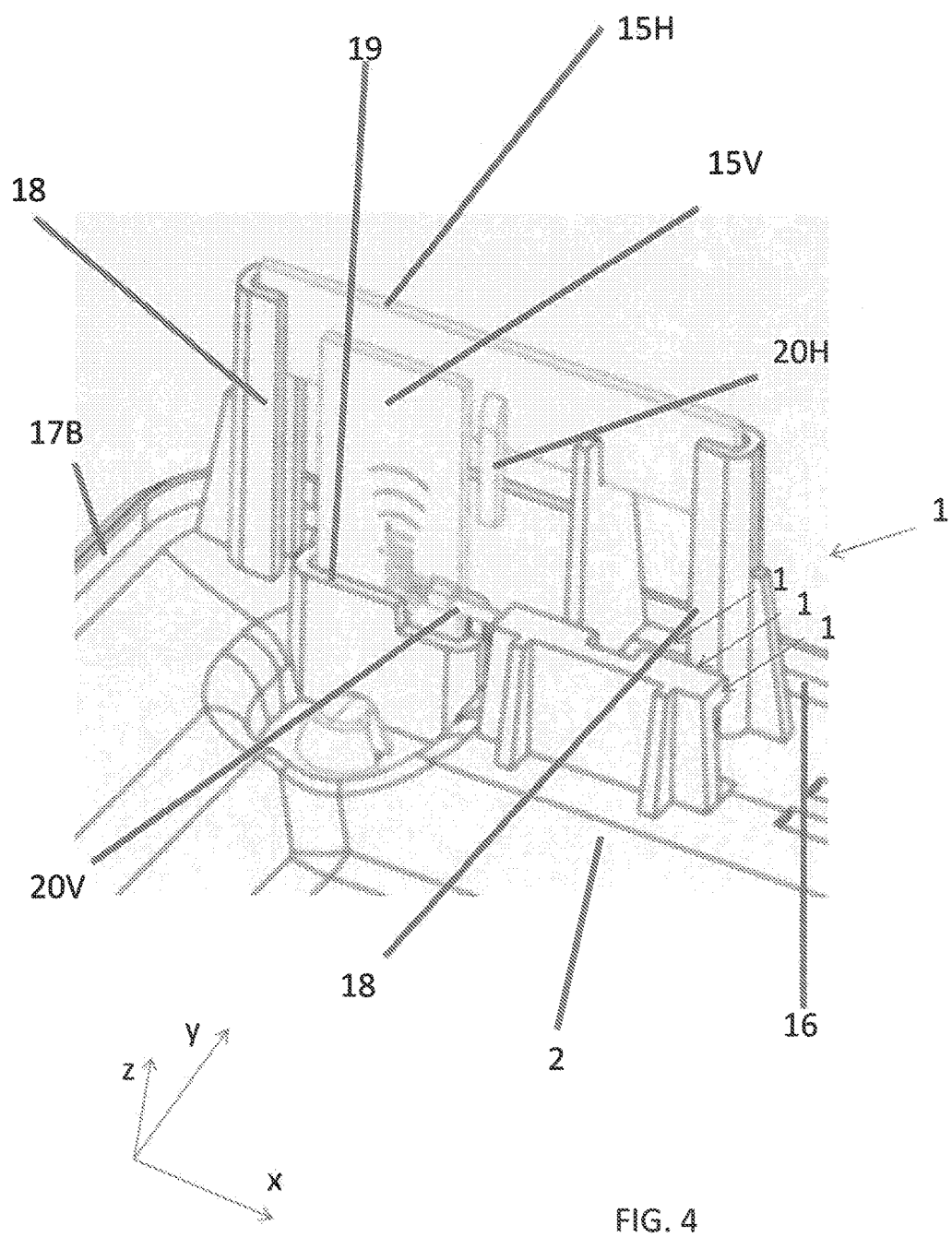
FIG. 4 is an interior perspective view of a section of the set top box according to the present principles.

FIG. 4 is a perspective view of the one antenna assembly 15 at the corner of the right side wall 17B and the front wall 16. This view more clearly shows how the antenna assemblies 15H, 15V according to the present principles can have either a horizontal orientation or a vertical orientation and also shows how the assemblies 15H, 15V are supported in the set top box. The antenna assemblies 15 can be supported by a slot 19 or by a pair of U-shaped pockets 18 with vertically oriented slots that face each other in which the vertical edges of the antenna assemblies 15H are held by the slots. In either case, the antenna assembly 15 can include a connector 20V, 20H and extends to an electrical connection component either underneath the antenna assembly or to the side of the antenna assembly. It should be pointed out the assembly 15H could alternatively be supported by a slot 19 and the assembly 15V could alternatively be supported by U-shaped pockets 18.

Figure 5:
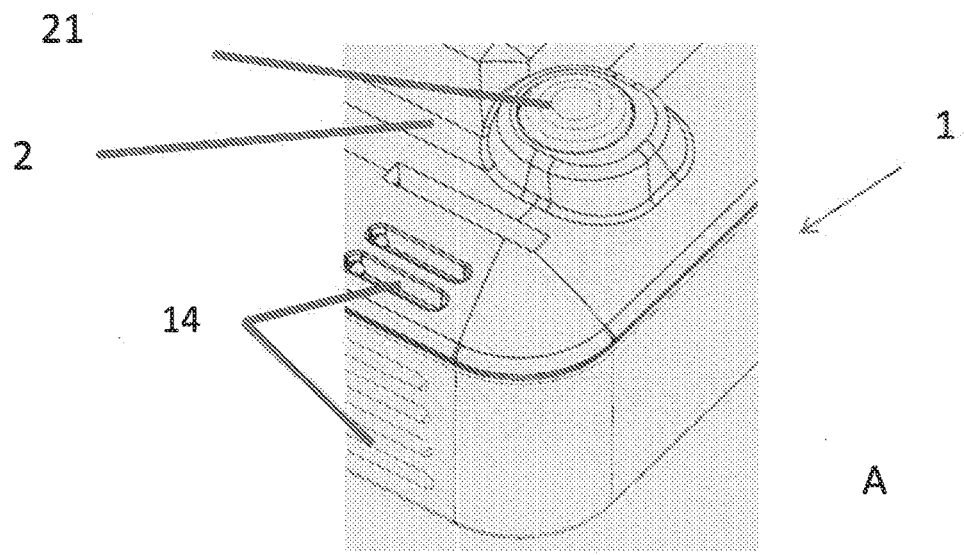
FIG. 5 shows bottom exterior perspective views of sections of the set top box according to the present principles.
Figure 5:
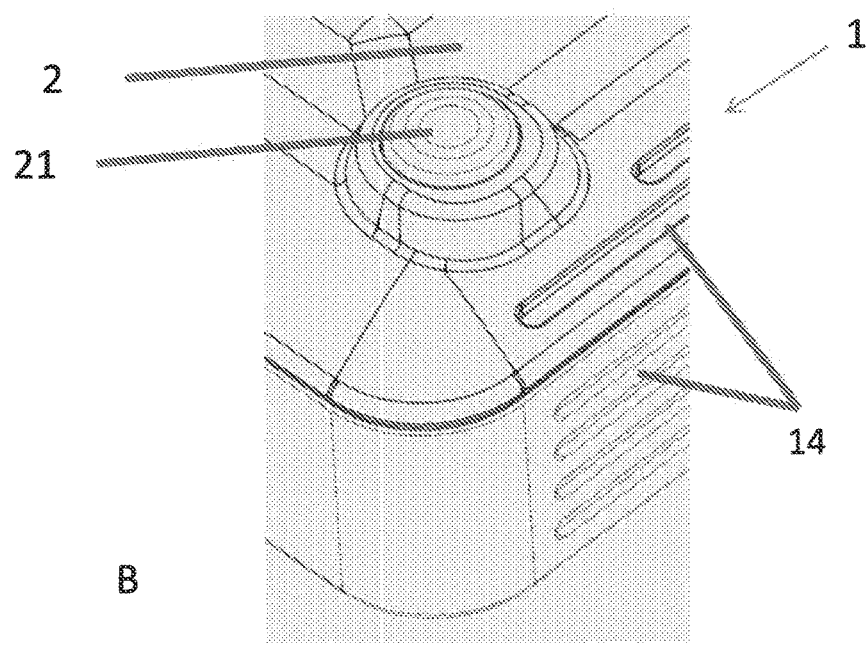

FIGS. 5A and 5B are a perspective bottom views of the set top box showing some of the heat dissipation vents or vent impressions 14 on the bottom frame 2 and on the side walls 17 in the vicinity of the antenna assemblies 15. In the vicinity of the antennae, these vents are "closed blind" to protect against electrostatic discharge and yet still maintain consistency in the aesthetic pattern of vents. ("Closed blind" means that there is an appearance of a vent for the aesthetic purposes but there is actually no vent or opening association with this feature.) These views also show the feet 21 in the bottom frame 2 which can be important to appropriately elevate the set top box on the supporting surface at a sufficient height to permit adequate heat dissipation by convection of air.

Figure 6:
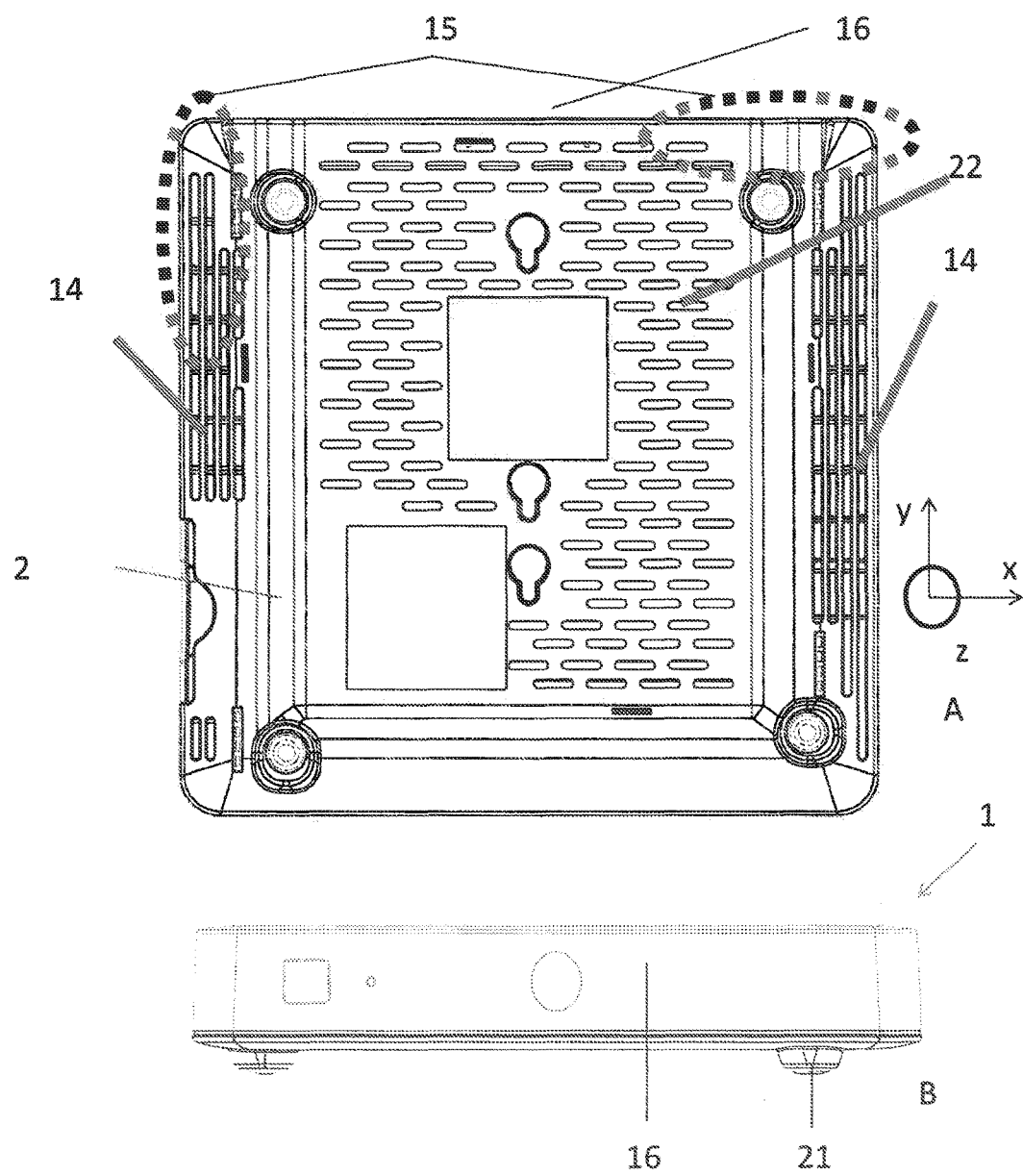
FIG. 6 shows exterior plan views of the set top box according to the present principles.

FIGS. 6A and 6B show a bottom plan view and a front plan view of the set top box according to the present principles, respectively. FIG. 6A shows a preferred pattern of the heat dissipation vents or vent impressions 14 on the bottom frame 2 in the vicinity of the antennae assemblies 15 and neighboring areas along the side of the set top box. In the vicinity of the antennae, these vents are closed blind to protect against electrostatic discharge and yet still maintain consistency in the aesthetic pattern of vents. Closed blind vents can be referred to as dummy vents. The vents outside the antenna assembly region can be open to assist with heat removal or dissipation. FIG. 6A shows other heat dissipation vents 22 in the bottom frame 2 in the vicinity of or underneath the main printed circuit board 5. FIG. 6B shows a plan front view of the electronic device and the feet 21 thereon, which shows front wall 16.

Figure 7:
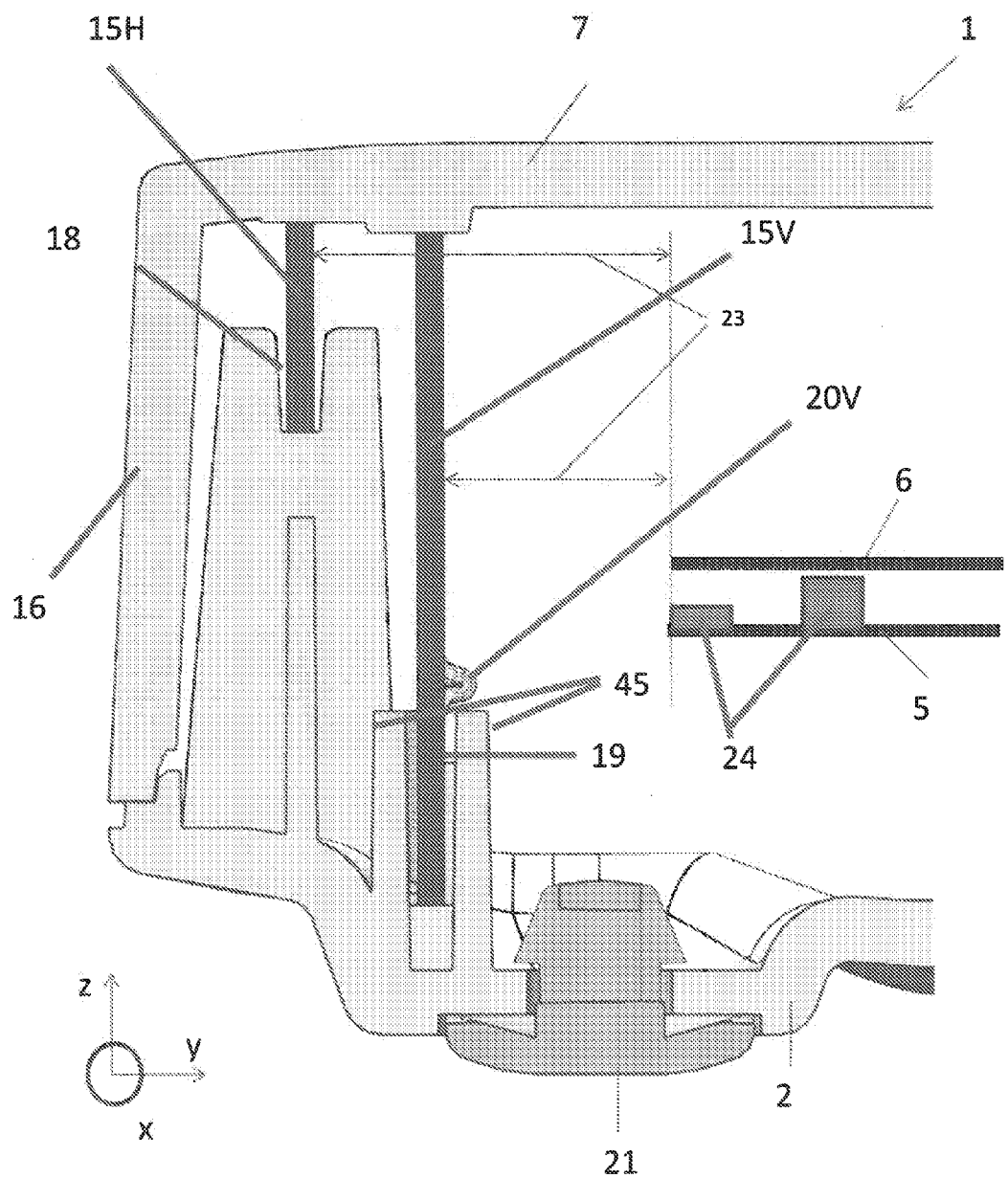
FIG. 7 is an interior sectional view of a section of the set top box according to the present principles.

FIG. 7 is a cross sectional interior view of the set top box. This view shows the feature of having a lateral dimension or spacing 23 between the antennae assemblies and metal components such as the heat sink 6 with the positioning tabs 79 and alignment features 80. This view shows that the lateral dimension or spacing 23 can also be between the antennae assemblies and the main printed circuit board 5 and/or metal components 24 thereon. It is preferable that the lateral dimension or spacing 23 exceed about 20 mm to create sufficient electrostatic discharge isolation regions or pockets. Here, the slots 18 and 19 which hold the antennae assemblies 15H and 15V can be non-metallic or plastic to prevent electrostatic discharge and can shield the antenna from openings such as the feet openings in the bottom frame 2 through which feet 21 are placed.

In sum, a feature of the present principles is that the antenna assemblies should be clear of metal components. This can be ensured by having the antenna assemblies being positioned outside the periphery of the printed circuit board. Ideally, no part of the antenna assemblies should be within 20 mm of metal components; as such, no part of the antenna assemblies should be within 20 mm of printed circuit board, because the main printed circuit board can include metal components thereon. The positioning tabs 79 and alignment features 80 (which are not shown in FIG. 7) assist in preventing discharge events by increasing the precision and accuracy of the positioning of the heat sink 6.

When operational performance of the antennae are deemed more important, mounting the rectangular antennae so that the long axis is oriented vertically is often required for the best performance. By orienting mounting foot details on the bottom of the set top box, it is possible to position antennae in ideal antennae locations and fit the antennae vertically. This allows the major form of the set top box to be thinner than the height of the vertical antennae; however, since foot mounting locations often require a hole for mounting rubber feet, there is the chance for electrostatic discharge to reach the wireless antennae. To prevent this, a set of walls 45 are added in the plastic detail to create a continuous barrier around the antennae. This is all integrated into the molded details of the plastic case of the bottom frame 2. By strategically placing the foot mounting locations and creating electrostatic discharge isolation pockets, wireless antennae can be mounted in small set top boxes in a manner that optimizes the performance of the wireless antennae and minimizes the size of the set top box. The isolation pocket can also aid in keeping interior components which are prone to cause electrostatic discharge events such as the heat sink and a printed circuit board sufficiently spaced from the antennae.

In an embodiment of the present principles, a thin, horizontally-oriented set top box is provided which can include a plastic case that forms an enclosure around internal electronics such as printed circuit board assemblies and heat sinks as shown in FIG. 8. (The enclosure can comprise vertically oriented walls that include a front wall 16, a first side wall 17A, a second side wall 17B, a rear wall 76, a base frame 2 and a top 7.) The wireless antennae 15 can be created as separate printed circuit boards so that they can be positioned away from the main printed circuit board and heat sinks. As printed circuit board structures, the wireless antenna can be a laminated structure having an antenna layer and a board layer. The optimal locations for antennae are on the outer perimeters of the plastic case. The optimal orientations of the antennae are such that the long axis of the antennae is vertical and these antennae need to be enclosed by the case. By positioning the case mounting foot locations in optimal antennae mounting locations, the vertical antennae can be mounted in the pocket created by the mounting location. This allows the major form of the case to be thinner than the height required by the antennae.

In some embodiments, the assembly of a rubber foot 21 becomes necessary to stabilize the set top box on tabletop surfaces in which a hole in the mounting detail of the plastic bottom is provided to hold the rubber foot. Openings in plastic enclosures, however, are pathways for electrostatic discharge to reach internal electronics and damage components. Since the foot mounting details need to be as small as possible for aesthetics, this puts the wireless antennae close to the opening for the rubber foot 21. As such, to prevent electrostatic discharge from reaching the wireless antenna, the addition of walls in the plastic detail (which can include the U-shaped pockets 18 and/or slots 19 formed into the bottom frame 2) can create a continuous barrier around the antennae. This is all integrated into the molded details of the plastic case.

It is important to note that two antennae locations in FIGS. 1-4 and 7 are shown for each applicable front corner with details for mounting the antennae in both horizontal and vertical orientations. This is done to show multiple possibilities of implementing the present principles. However, physical testing and consumer preference with regards to form factor preference, size preference, and performance preference dictate the actual orientation to employ, which is generally only one antenna being placed in each applicable corner. Also, it should be noted that the antennae designed for horizontal placement are longer and narrower than the antennae designed for vertical placement.

In other words, the vertical and horizontal orientations of the antennae assemblies are shown to emphasize that the present principles can include both types of orientations in which the set top box can be oriented either vertically or horizontally; or the present principles can include the use of two antennae of both orientations in each applicable corner as shown in FIG. 7.

Figure 9:
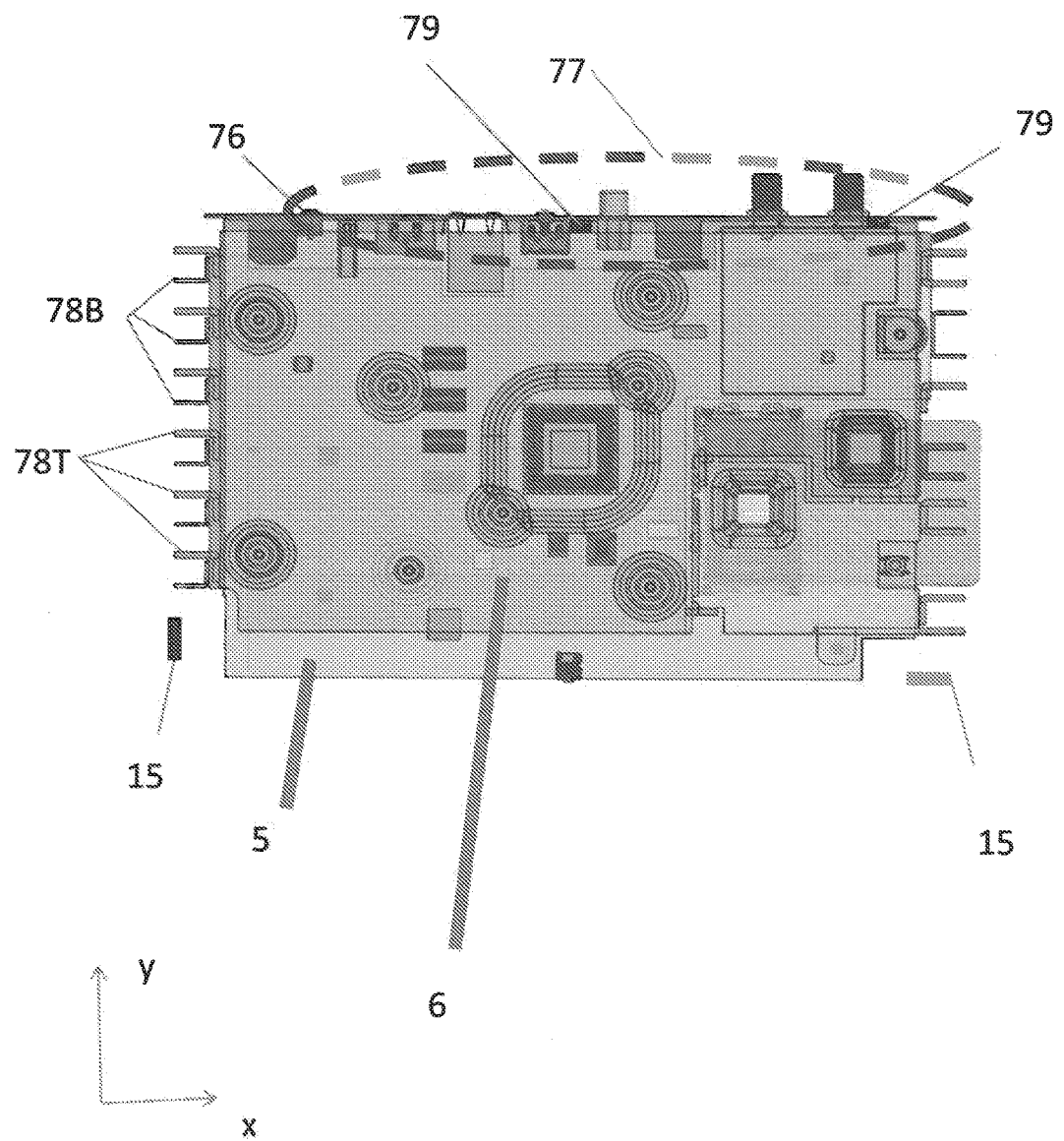
FIG. 9 shows an interior top plan view of the set top box according to the present principles.

FIG. 9 is a top plan interior view of a set top box showing how the top heat sink 6 is positioned over the circuit board 5 and how the printed circuit board 5 and heat sink 6 are spaced from the antennae 15. The heat sink 6 can include fins 78T. Another set of fins 78B can lie between 78T and can be connected to a bottom heat sink 6A which is not shown in this figure. The heat sink 6 has the positioning tabs 79 that engage features of the panel jack 77 on the rear wall 76 to ensure the accurate alignment of the heat sink 6. Alternatively, the positioning tabs 79 that contact or push up to a planar interior portion of the panel jack 77 to provide for the lateral rotational positioning of the heat sink 6.

In an embodiment, the device can have the positioning tabs 79 and/or alignment features 80 on the perimeter of the heat sink 6 with notches that engage the edge of the printed circuit board 5 and the inner face of the rear jack panel 77 to provide alignment until the mounting screws or the like 72 can be driven. A particular embodiment has four alignment features 80 (which is not shown in FIG. 9) that align with the edges of the printed circuit board 5 and two tabs 79 that align the heat sink 6 with the rear jack panel 77.

Figure 10:
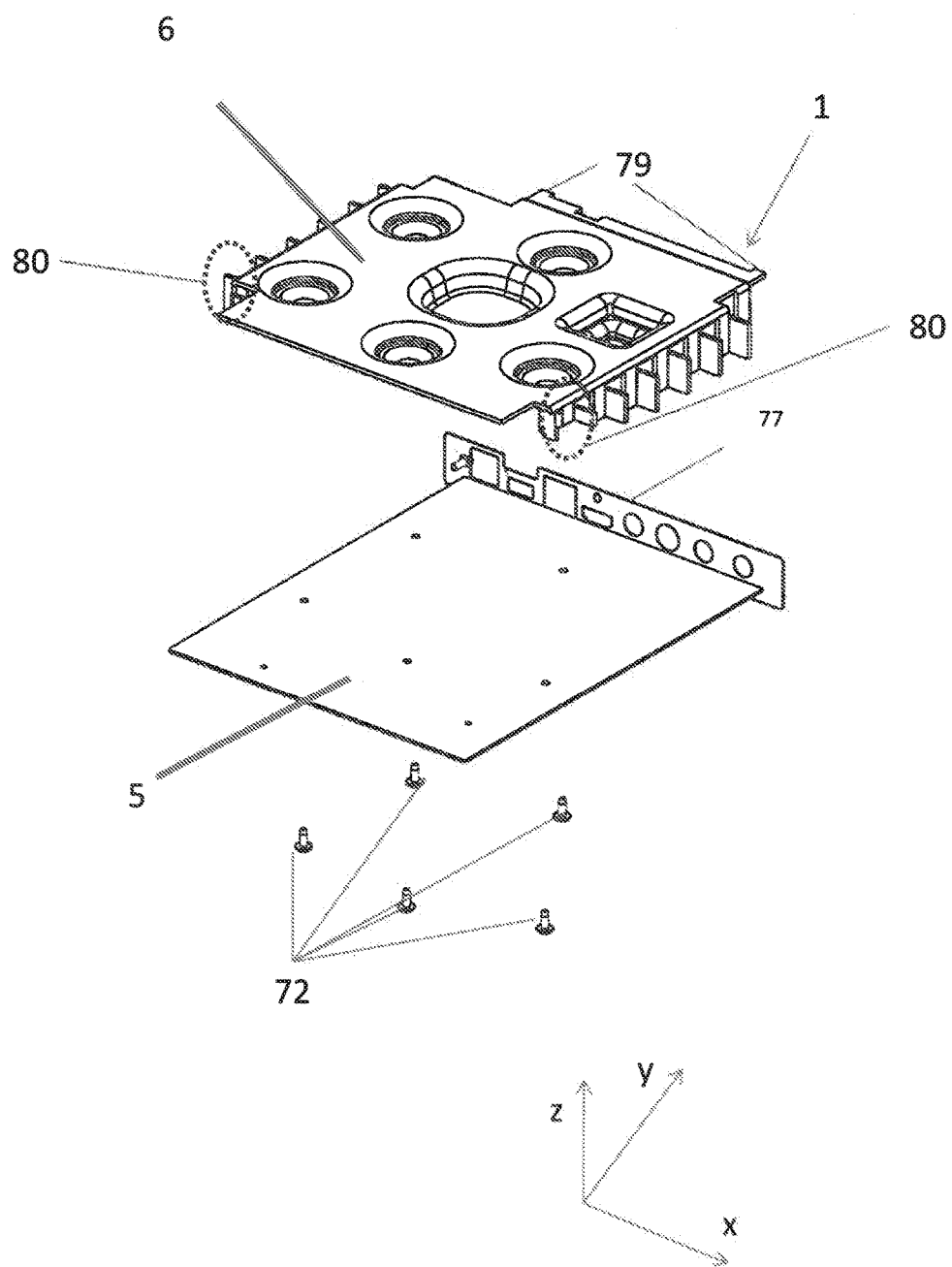
FIG. 10 shows an interior perspective view of the circuit board 5 and top heat sink 6 according to the present principles.

FIG. 10 shows an interior perspective view of the circuit board 5 and top heat sink 6. Here, the rear edge of the heat sink 6 engages the panel jack 77. The heat sink 6 has the tabs 79 on its rear edge for this engagement.

Figure 11:
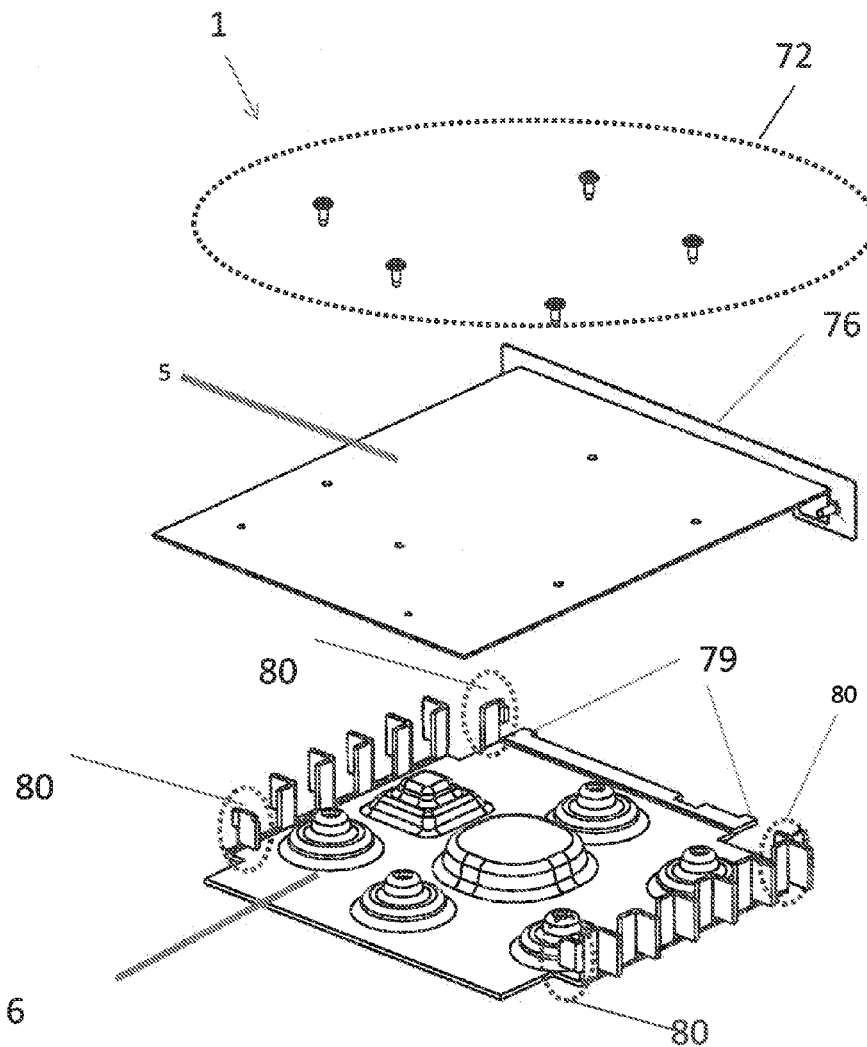
FIG. 11 shows an interior bottom perspective view of the circuit board 5 and top heat sink 6 according to the present principles.

FIG. 11 shows an interior bottom perspective view of the circuit board 5 and top heat sink 6. This figure shows the alignment features 80 on the heat sink which are on the sides of the heat sink and engage the edges of the printed circuit board 5 for alignment with the printed circuit board 5, which help during the assembly process.

Figure 12:
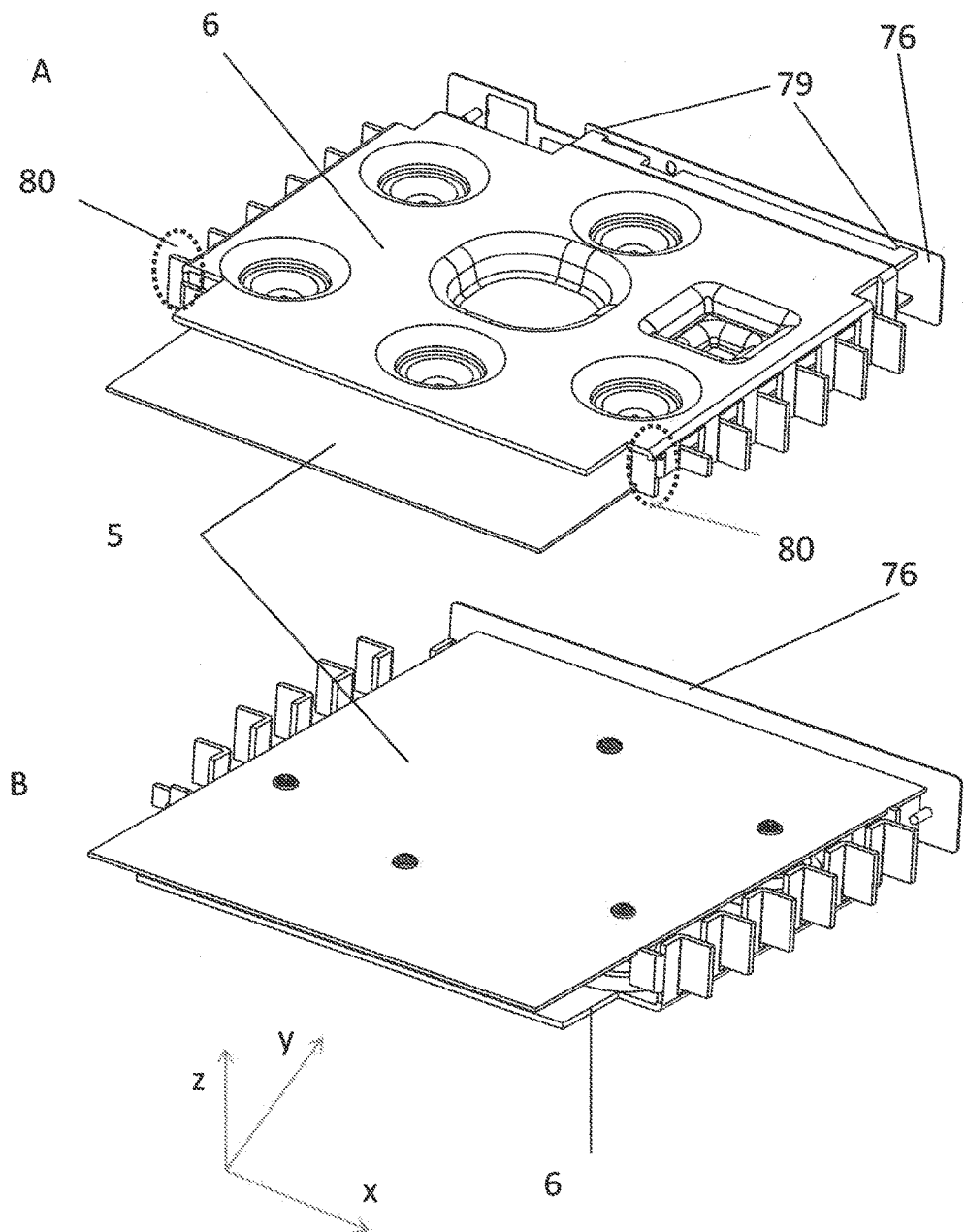
FIG. 12 shows perspective views of the heat sink and printed circuit board engagement according to the present principles.

FIGS. 12A and 12B show top and bottom perspective views, respectively, of the heat sink 6 and printed circuit board 5 as they are engaged.

Figure 13:
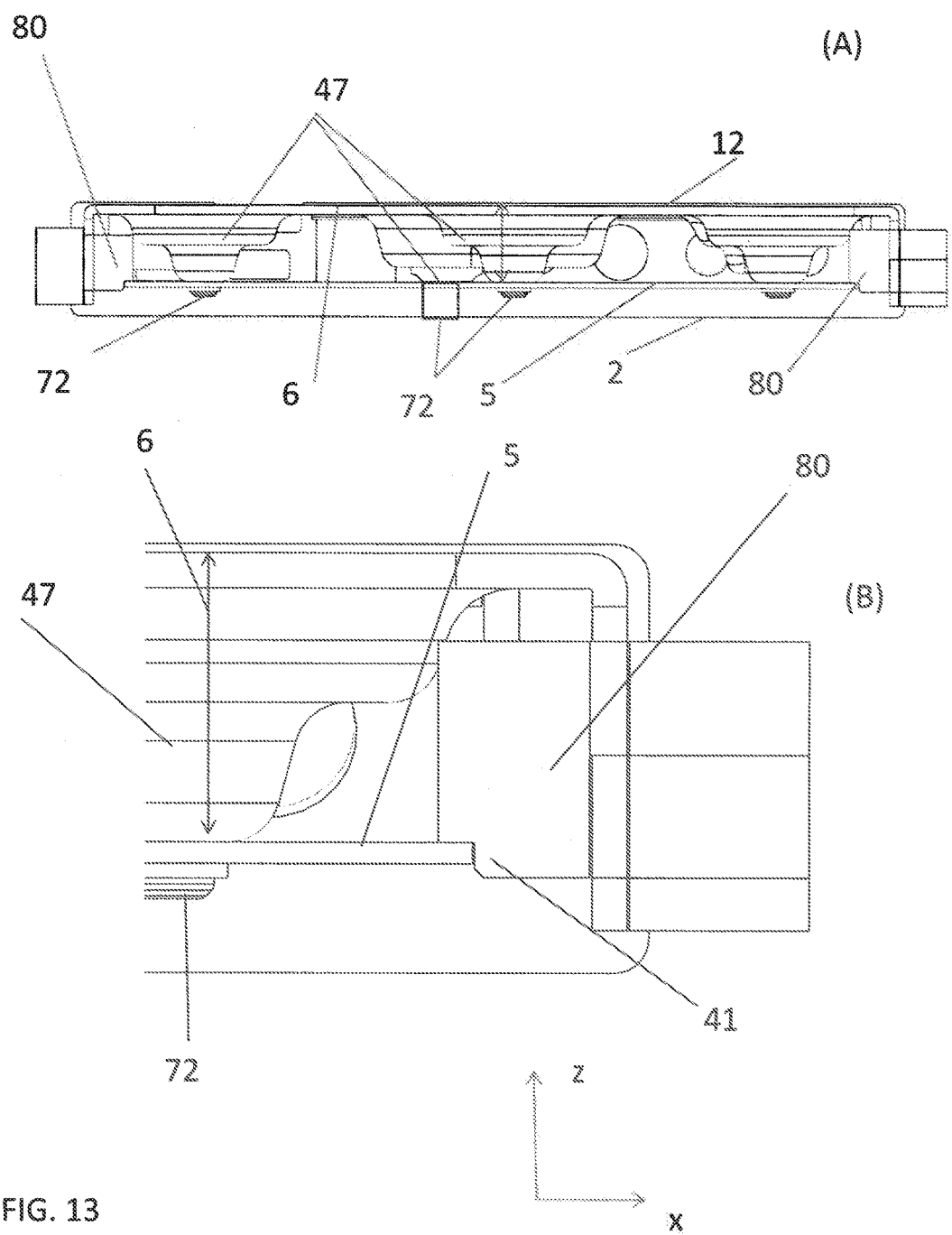
FIG. 13 shows sectional views of the heat sink 6 and the printed circuit board 5 according to the present principles.

FIGS. 13A and 13B show additional sectional views of the heat sink 6 and the printed circuit board 5. These views show in part how the heat sink is supported and aligned with the printed circuit board. These figures show the alignment feature 80 of the heat sink with a piece that extends from the periphery of the planar peripheral portion 12 of the heat sink 6. The alignment feature 80 has an edge at the bottom or corner, which can be a right angle piece that fits around the edge of the printed circuit board 5. The alignment features 80 are on both sides of the heat sink. This feature extends downward and away from the planar portion 12. The feature 80 has an edge or corner directed inward that matches the top edge contour of the printed circuit board 5 to align the heat sink 6 with the printed circuit board.

Figure 14:
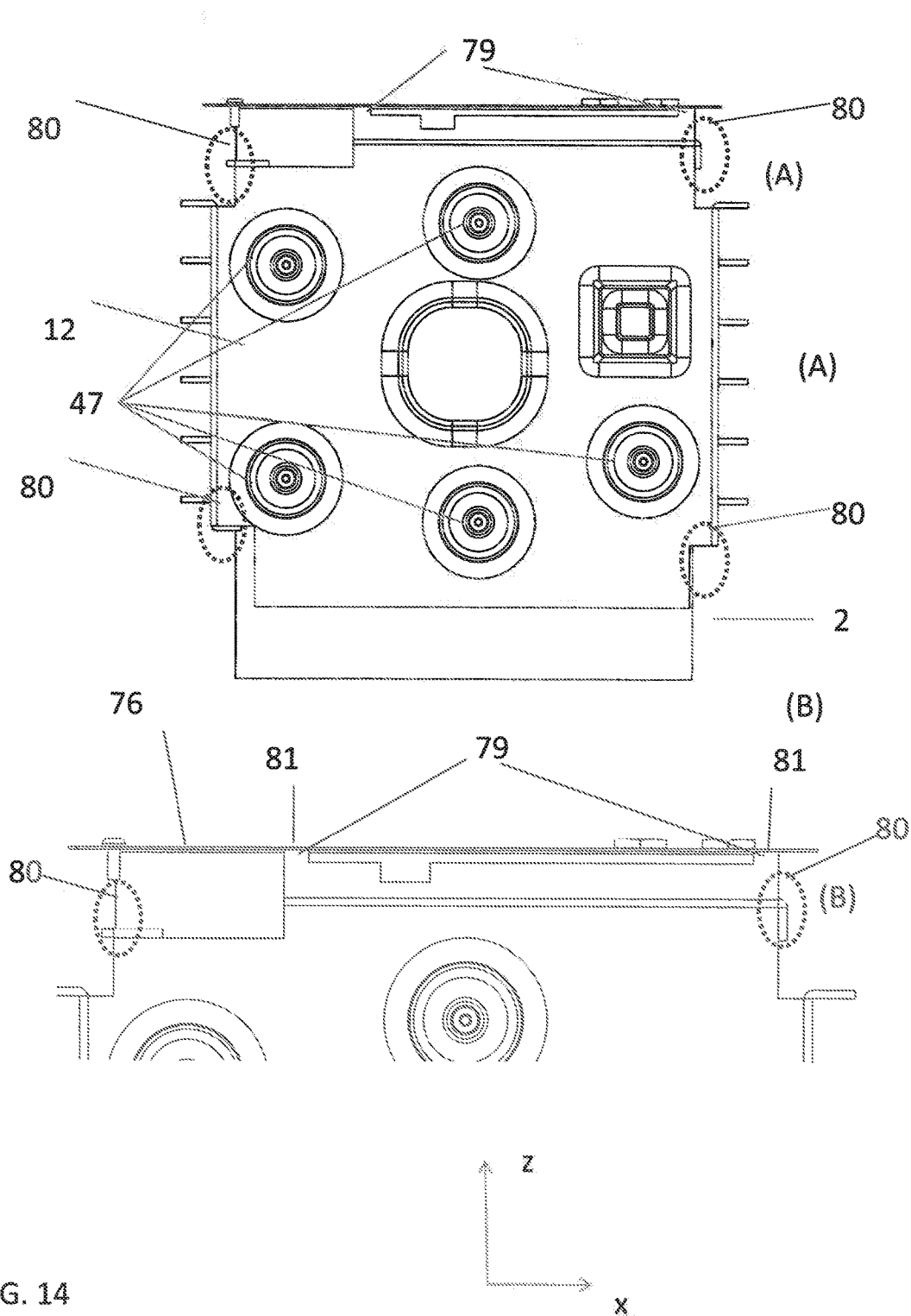
FIG. 14 shows top plan views of the heat sink 6 according to the present principles.

FIGS. 14A and 14B show top plan views of the heat sink 6 and how the tabs 79 of the heat sink 6 engage the rear wall 76 around the panel jack, which can have slots 81. The slots 81 engage the tabs for the alignment. Although beneficial, the slots are optional in that the tabs 79 can be effective in contacting a controlled flat interior surface.

Figure 15:
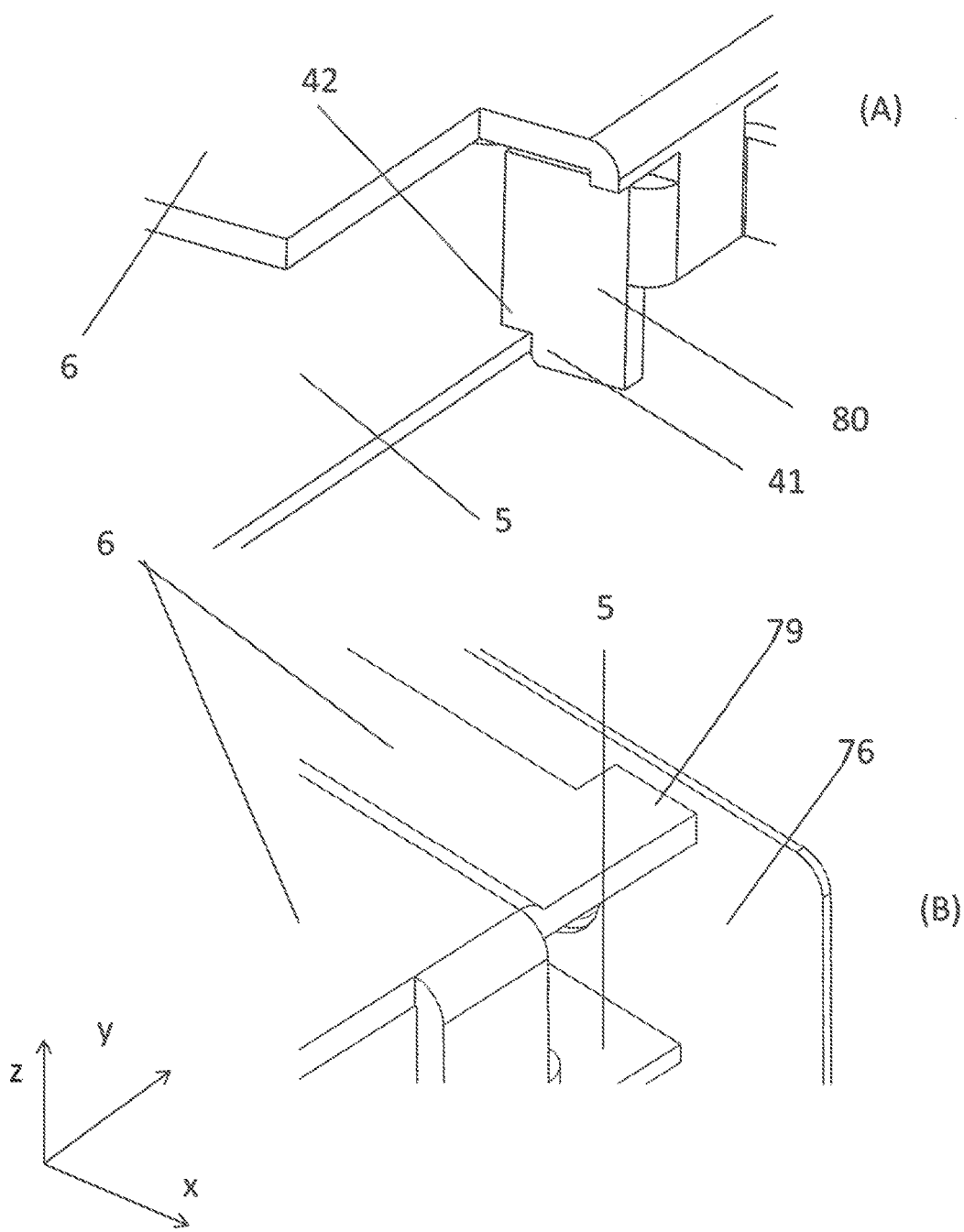
FIG. 15 shows perspective views highlighting the alignment features 80 on the heat sink 6 according to the present principles.
Figure 16:
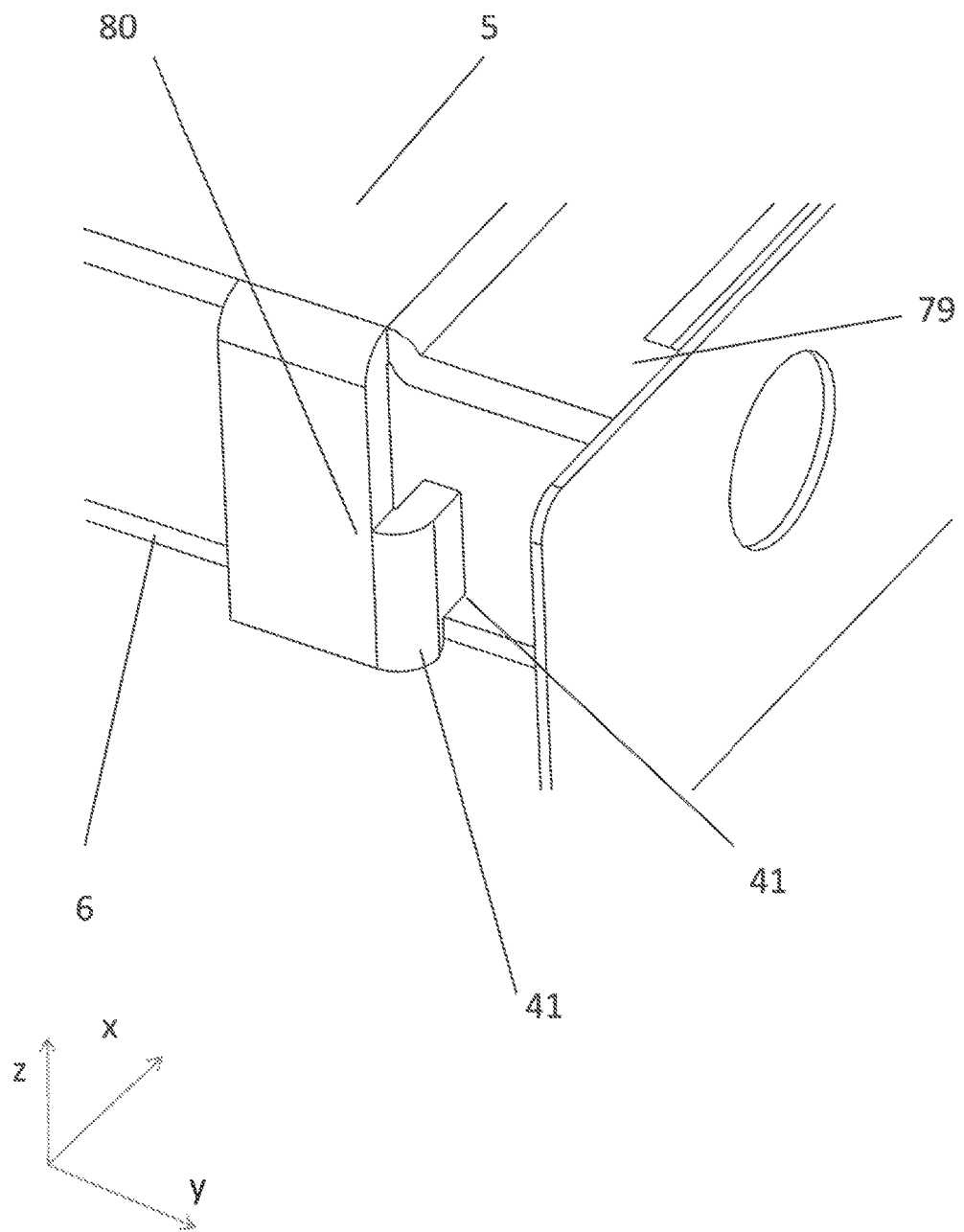
FIG. 16 shows a perspective of the alignment features 80 on the heat sink 6 according to the present principles.

FIGS. 15A, 15B and 16 show various perspective views highlighting the tabs 79 and alignment features 80 on the heat sink 6.

In sum, disclosed is an electronic device such as a set top box that includes a printed circuit board (which can be generally planar and have a contact pad or contact portion for transfer of heat to a heat sink). The circuit board has a peripheral edge and rear wall (which can have a panel jack of connections and have interior orientation indents 81 or a controlled interior surface which could be flat or have a controlled surface for rotational alignment of a heat sink with the printed circuit board). The heat sink has a generally planar peripheral portion 12 and an interior depression region 47 that thermally contacts the printed circuit board (preferably at a contact pad or at a heat generating component on the printed circuit board) in which the heat sink has a rear edge with at least one protruding tab that contacts the interior surface of the rear wall or the panel jack (in which the tabs can engage indents 81 or the controlled interior surface to provide rotation orientation about a z-axes and/or height control in a y-axis). Further, the heat sink can have at least one orientation features 80 on at least two edges of the heat sink that extend downward from the edges to contact edges of the printed circuit board (which can be designed such that the contact features can have a horizontal surface contacting an upper horizontal surface of the printed circuit board and/or have a vertical surface contacting a vertical edge surface of the printed circuit board to provide height control and further rotational orientation control). Additionally, the heat sink can have a plurality of other depressions 47 that contact the printed circuit board or go through the printed circuit board such that the heat sink can be attached either to the printed circuit board and/or the base frame through the printed circuit board in which the attachment can be achieved through screws, bolts, rivets, clips, or other attachment features 72. This implies that some of the depressions 47 shown in FIG. 14A, can make mechanical contact with the base frame 2 to secure the heat sink and/or the circuit board. The heat sink and printed circuit board can have predetermined and controlled edge surfaces such that the tabs and orientation features provide a controlled spacing of edges of heat sink from other components that are laterally spaced from the printed circuit board (in which the other components can be antennae).

The alignment features 80 can be characterized as extending vertically downward from the two opposing edges of the periphery of the heat sink in which they each comprise: a vertical wall portion 41 that contacts a vertical portion of the opposing ends of the peripheral edge of the printed circuit board and a horizontal ledge portion 42 that protrudes inwardly from the vertical wall portion, the horizontal ledge portion contacts a horizontal surface of the printed circuit board near peripheral edge of the printed circuit board.

These alignment features 80 and positioning tabs 79 can precisely orient the heat sink and/or the circuit board by having some depressions 47 mechanically contact the base frame 2 through the circuit board. Here, the circuit board can have holes or features for attachment that have enough play or tolerance to allow the circuit board to have positional freedom to be urged by the alignment features 80 to the correct and predetermined locations when the attachment features 72 are employed. As suggested above, in part, the rear wall and/or the panel jack (which can be part of the rear wall) can have a controlled surface that is precisely positioned with respect to attachment positions in the base frame 2, in the printed circuit board, and/or in the heat sink to cause the heat sink and/or circuit board to be precisely aligned and/or positioned with the electronic device. This alignment can help to ensure that the heat sink and/or circuit board are adequately spaced from at least one antenna assembly. Likewise, the depressions 47 which can contact the base frame 2 and/or the circuit board can have enough play or tolerance to allow for some positional freedom to allow the alignment of the heat sink, in general, to be guided by the tabs 79 contacting the controlled surface.

Figure 17:
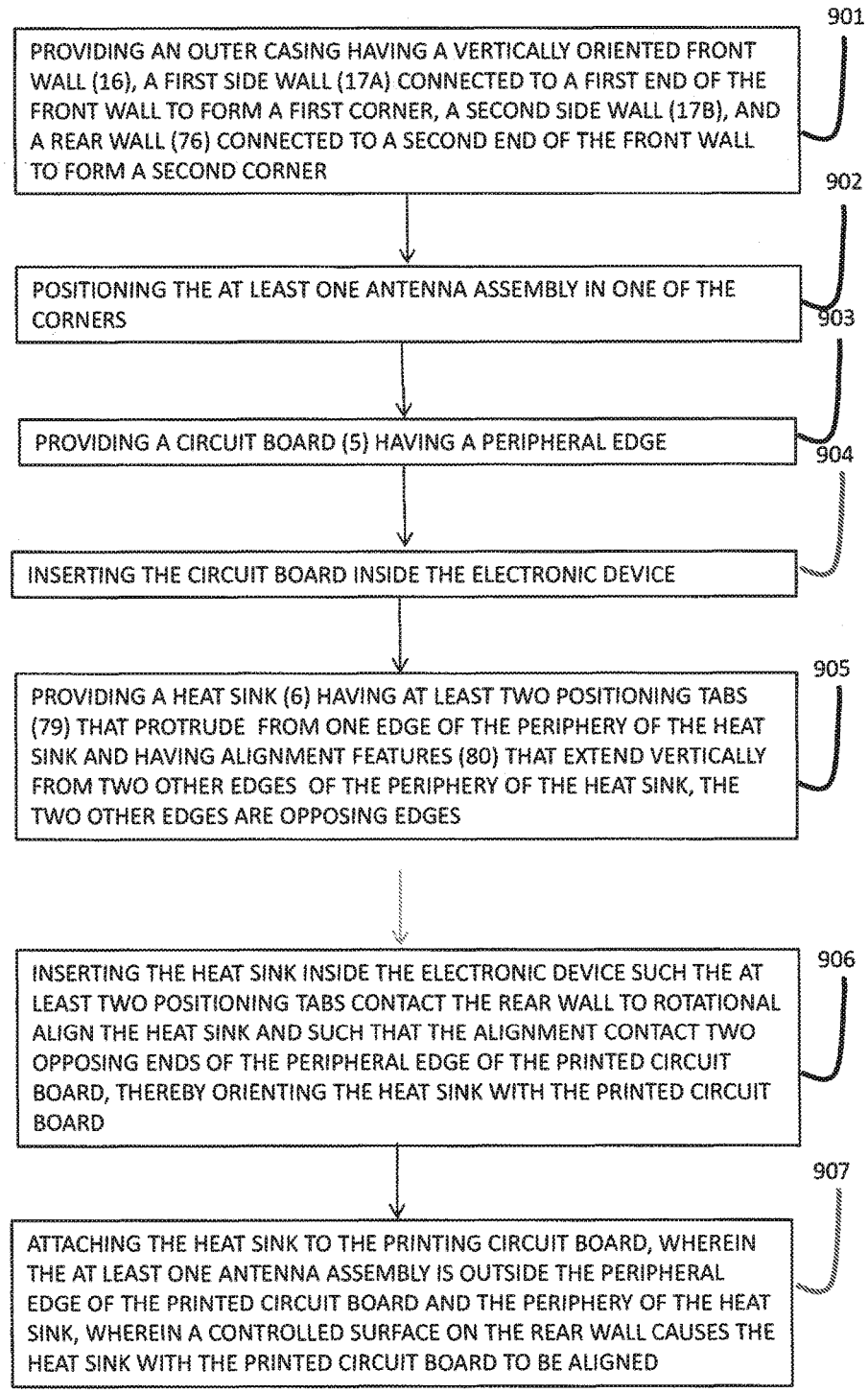
FIG. 17 is a flowchart outlining the method of assembling the electronic device according to the present principles.

FIG. 17 depicts a flow chart that depicts the steps of a method of assembling an electronic device in accordance with the present principles. The method commences at step 901 by providing) an outer casing having a vertically oriented front wall 16, a first side wall 17A connected to a first end of the front wall to form a first corner, a second side wall 17B, and a rear wall 76 connected to a second end of the front wall to form a second corner. During step 902,) the at least one antenna assembly is positioned in one of the corners. During step 903, a circuit board (5) is provided having a peripheral edge. The circuit board is inserted inside the electronic device during step 904. During step 905, a heat sink (6) is provided having at least two positioning tabs (79) that protrude from one edge of the periphery of the heat sink and having alignment features (80) that extend vertically from two other edges of the periphery of the heat sink, the two other edges are opposing edges. During step 906; the heat sink is inserted inside the electronic device such the at least two positioning tabs contact the rear wall to rotational align the heat sink and such that the alignment contact two opposing ends of the peripheral edge of the printed circuit board, thereby orienting the heat sink with the printed circuit board. Lastly, during step 907, the heat sink is attached to the printed circuit board, wherein the at least one antenna assembly is outside the peripheral edge of the printed circuit board and the periphery of the heat sink 18. The method can include a step of providing a control surface on the rear wall that causes the heat sink with the printed circuit board to be aligned.

It should be noted that the although the expression heat sink is used in the specification and in the claims, it is intended that the expression heat sink is intended to alternatively mean heat spreading.

Also, it is intended that the expressions "rear wall" and "front wall" and the expressions "vertical" and "horizontal" are intended to be construed from the perspective of the observer of the figures; and as such, these expression can be interchanged depending upon the direction that observer looks at the device.

Although the illustrative embodiments have been described herein with reference to the accompanying drawings, it is to be understood that the present principles is not limited to those precise embodiments, and that various changes and modifications may be effected therein by one of ordinary skill in the pertinent art without departing from the scope of the present principles. All such changes and modifications are intended to be included within the scope of the present principles as set forth in the appended claims.

The invention claimed is:

1. An electronic device comprising:
   at least two vertically oriented walls;
   a circuit board having a peripheral edge positioned in the electronic device;
   a heat sink contacting the circuit board, the heat sink having orientation features on a periphery of the heat sink, wherein the orientation features comprise alignment features that extend vertically and vertically downward from two opposing edges of the periphery of the heat sink, the alignment features contact two opposing ends of the peripheral edge of the printed circuit board to orient the heat sink with respect to the circuit board, the alignment features comprising a vertical wall portion that contacts a vertical portion of the opposing ends of the peripheral edge of the printed circuit board, and a horizontal ledge portion that protrudes inwardly from the vertical wall portion, the horizontal ledge portion contacts a horizontal surface of the printed circuit board near peripheral edge of the printed circuit board; and
   a first antenna assembly positioned inside the electronic device adjacent to one of the vertically oriented walls, wherein the first antenna assembly is positioned outside the peripheral edge of the circuit board and the periphery of the heat sink.

2. The electronic device of claim 1 wherein the orientation features comprise at least two positioning tabs protruding from one edge of the periphery of the heat sink, the positioning tabs contact the other of the vertically oriented walls.

3. The electronic device of claim 2 wherein the heat sink has a horizontal planar peripheral portion from which two of the positioning tabs protrude, the positioning tabs rotationally align the heat sink with the printed circuit board.

4. The electronic device of claim 3 wherein the positioning tabs rotationally align the heat sink such that the heat sink is maintained a predetermined distance from the first antenna assembly.

5. The electronic device of claim 3 wherein the orientation features comprise alignment features that extend vertically from two other edges of the periphery of the heat sink, the two other edges are opposing edges, the alignment feature contact two opposing ends of the peripheral edge of the printed circuit board.

6. The electronic device of claim 1 comprises a second antenna assembly positioned inside the electronic device;
   wherein the vertically oriented walls include a front wall; a first side wall connected to a first end of the front wall to form a first corner; a second side wall connected to a second end of the front wall to form a second corner; and a rear wall; and
   wherein the first antenna assembly is positioned adjacent to the first corner and the second antenna assembly positioned adjacent to the second corner.

7. The electronic device of claim 6 wherein the orientation features comprise at least two positioning tabs protruding from one edge of the periphery of the heat sink, the positioning tabs contact the front wall or the rear wall to rotationally orient the heat sink.

8. The electronic device of claim 7 wherein the heat sink has a horizontal planar peripheral portion from which two of the positioning tabs protrude, the positioning tabs rotationally align the heat sink with the printed circuit board.

9. The electronic device of claim 8 wherein the positioning tabs rotationally align the heat sink such that the heat sink is maintained at a predetermined distance or distances from the first and second antenna assemblies.

10. The electronic device of claim 6 wherein the orientation features comprise alignment features that extend vertically from two opposing edges of the periphery of the heat sink, the alignment feature contact two opposing ends of the peripheral edge of the printed circuit board to orient the heat sink with the printed circuit board.

11. The electronic device of claim 8 wherein the orientation features comprise alignment features that extend vertically from two other edges of the periphery of the heat sink, the two other edges are opposing edges, the alignment feature contact two opposing ends of the peripheral edge of the printed circuit board.

12. The electronic device of claim 10 wherein the alignment features extend vertically downward from the two opposing edges of the periphery of the heat sink and the alignment features each comprise:
   a vertical wall portion that contacts a vertical portion of the opposing ends of the peripheral edge of the printed circuit board; and
   horizontal ledge portion that protrudes inwardly from the vertical wall portion, the horizontal ledge portion contact a horizontal surface of the printed circuit board near peripheral edge of the printed circuit board.

13. The electronic device of claim 5 comprises attachment means that secures the heat sink to the circuit board, wherein the attachment means also secures the circuit board to a bottom frame of the electronic device; and
   wherein the alignment features orient the printed circuit board.

14. The electronic device of claim 13 wherein the attachment means secures the heat sink to the circuit board through depressions that extend toward the printed circuit board from a planar portion of the heat sink and the attachment means secures the circuit board to a bottom frame at attachment points under the depressions; and
   wherein the alignment features orient the printed circuit board.

15. The electronic device of claim 7 wherein the at least two positioning tabs contact the rear wall and the rear wall comprises a panel jack.

16. The electronic device of claim 15 wherein the side walls have vents and the antenna assemblies are perpendicular to one another.

17. A method of assembling an electronic device having at least one antennae comprising the steps of:
providing an outer casing having a vertically oriented front wall, a first side wall connected to a first end of the front wall to form a first corner, a second side wall, and a rear wall connected to a second end of the front wall to form a second corner;
positioning the at least one antenna assembly in one of the corners;
providing a circuit board having a peripheral edge;
inserting the circuit board inside the electronic device;
providing a heat sink having at least two positioning tabs that protrude from one edge of the periphery of the heat sink and having alignment features that extend vertically and vertically downward from two other edges of the periphery of the heat sink, the two other edges are opposing edges, the alignment features comprising a vertical wall portion that contacts a vertical portion of the opposing ends of the peripheral edge of the circuit board, and a horizontal ledge portion that protrudes inwardly from the vertical wall portion, the horizontal ledge portion contacts a horizontal surface of the circuit board near the peripheral edge of the circuit board;
inserting the heat sink inside the electronic device such the at least two positioning tabs contact the rear wall to rotational align the heat sink and such that the alignment features contact two opposing ends of the peripheral edge of the printed circuit board, thereby orienting the heat sink with the printed circuit board; and
attaching the heat sink to the printing circuit board, wherein the at least one antenna assembly is outside the peripheral edge of the printed circuit board and the periphery of the heat sink.

18. The method of claim 17 comprising the step of providing a controlled surface on the rear wall that causes the heat sink with the printed circuit board to be aligned.

* * * * *